(12) United States Patent
Hotta et al.

(10) Patent No.: US 10,002,743 B2
(45) Date of Patent: Jun. 19, 2018

(54) MEASUREMENT SYSTEM AND MEASUREMENT METHOD

(71) Applicant: HITACHI HIGH-TECHNOLOGIES CORPORATION, Tokyo (JP)

(72) Inventors: Shoji Hotta, Tokyo (JP); Hiroki Kawada, Tokyo (JP); Osamu Inoue, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days. days.

(21) Appl. No.: 15/305,740

(22) PCT Filed: Apr. 21, 2015

(86) PCT No.: PCT/JP2015/062062
§ 371 (c)(1),
(2) Date: Oct. 21, 2016

(87) PCT Pub. No.: WO2015/163307
PCT Pub. Date: Oct. 29, 2015

(65) Prior Publication Data
US 2017/0047197 A1      Feb. 16, 2017

(30) Foreign Application Priority Data

Apr. 25, 2014   (JP) ................................. 2014-090858

(51) Int. Cl.
*H01J 37/28* (2006.01)
*G03F 9/00* (2006.01)
(Continued)

(52) U.S. Cl.
CPC .............. *H01J 37/28* (2013.01); *G01B 15/04* (2013.01); *G03F 7/70633* (2013.01);
(Continued)

(58) Field of Classification Search
CPC .......... H01J 37/26; H01J 37/266; H01J 37/28; H01J 2237/2803
(Continued)

(56) References Cited

U.S. PATENT DOCUMENTS

2001/0006216 A1    7/2001  Koike
2013/0187045 A1    7/2013  Kobayashi et al.
(Continued)

FOREIGN PATENT DOCUMENTS

JP     09-180667 A    7/1997
JP    2000-243695 A   9/2000
(Continued)

OTHER PUBLICATIONS

International Search Report of PCT/JP2015/062062 dated Jul. 21, 2015.

*Primary Examiner* — Nicole Ippolito
(74) *Attorney, Agent, or Firm* — Mattingly & Malur, PC

(57) ABSTRACT

For scanning electron beams and measuring overlay misalignment between an upper layer pattern and a lower layer pattern with high precision, electron beams are scanned over a region including a first pattern and a second pattern of a sample, the sample having the lower layer pattern (the first pattern) and the upper layer pattern (the second pattern) formed in a step after a step of forming the first pattern. The electron beams are scanned such that scan directions and scan sequences of the electron beams become axial symmetrical or point-symmetrical in a plurality of pattern position measurement regions defined within the scan region for the electron beams, thereby reducing measurement errors resulting from the asymmetry of electric charge.

20 Claims, 17 Drawing Sheets

(51) Int. Cl.
*G01B 15/04* (2006.01)
*H01J 37/22* (2006.01)
*G03F 7/20* (2006.01)

(52) U.S. Cl.
CPC ............ *G03F 9/7061* (2013.01); *H01J 37/22* (2013.01); *H01J 2237/2803* (2013.01)

(58) Field of Classification Search
USPC .......................... 250/306, 307, 309, 310, 311
See application file for complete search history.

(56) References Cited

U.S. PATENT DOCUMENTS

2014/0320627 A1* 10/2014 Miyamoto .......... G03F 7/70633
    348/80
2015/0285627 A1   10/2015 Yamaguchi et al.

FOREIGN PATENT DOCUMENTS

| JP | 2001-189263 A | 7/2001 | |
|---|---|---|---|
| JP | 2014-016174 A | 1/2014 | |
| WO | 2012/001883 A1 | 1/2012 | |
| WO | WO2013/118613 A1 * | 8/2013 | ............. G01B 15/04 |

* cited by examiner

FIG.1 (a)
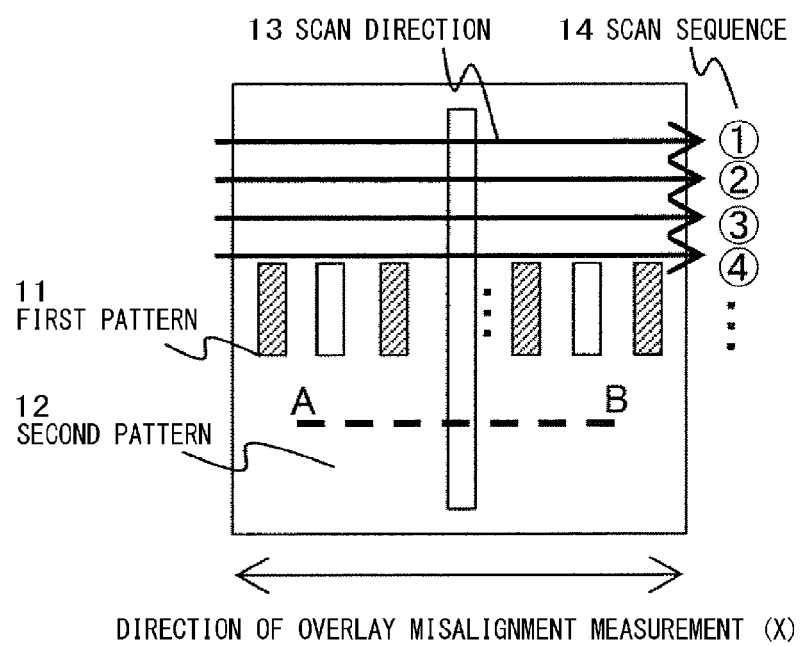
13 SCAN DIRECTION  14 SCAN SEQUENCE
11 FIRST PATTERN
12 SECOND PATTERN
DIRECTION OF OVERLAY MISALIGNMENT MEASUREMENT (X)
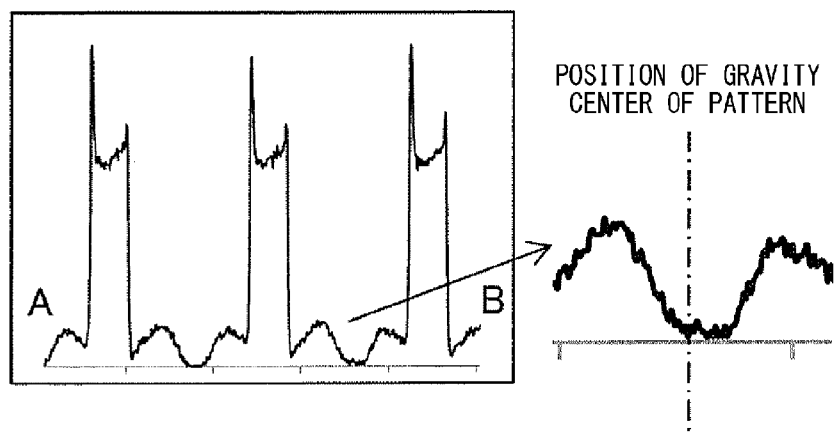
POSITION OF GRAVITY CENTER OF PATTERN

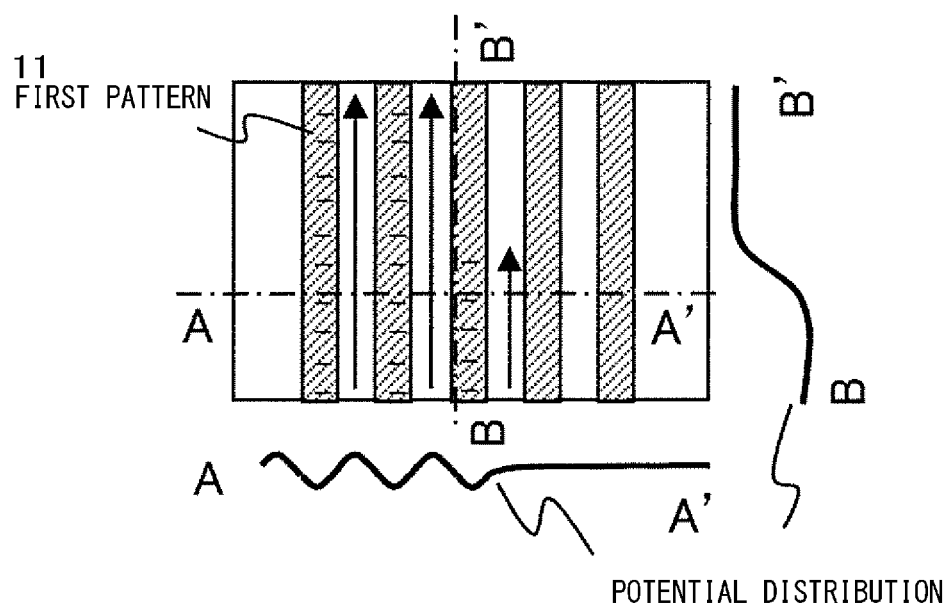

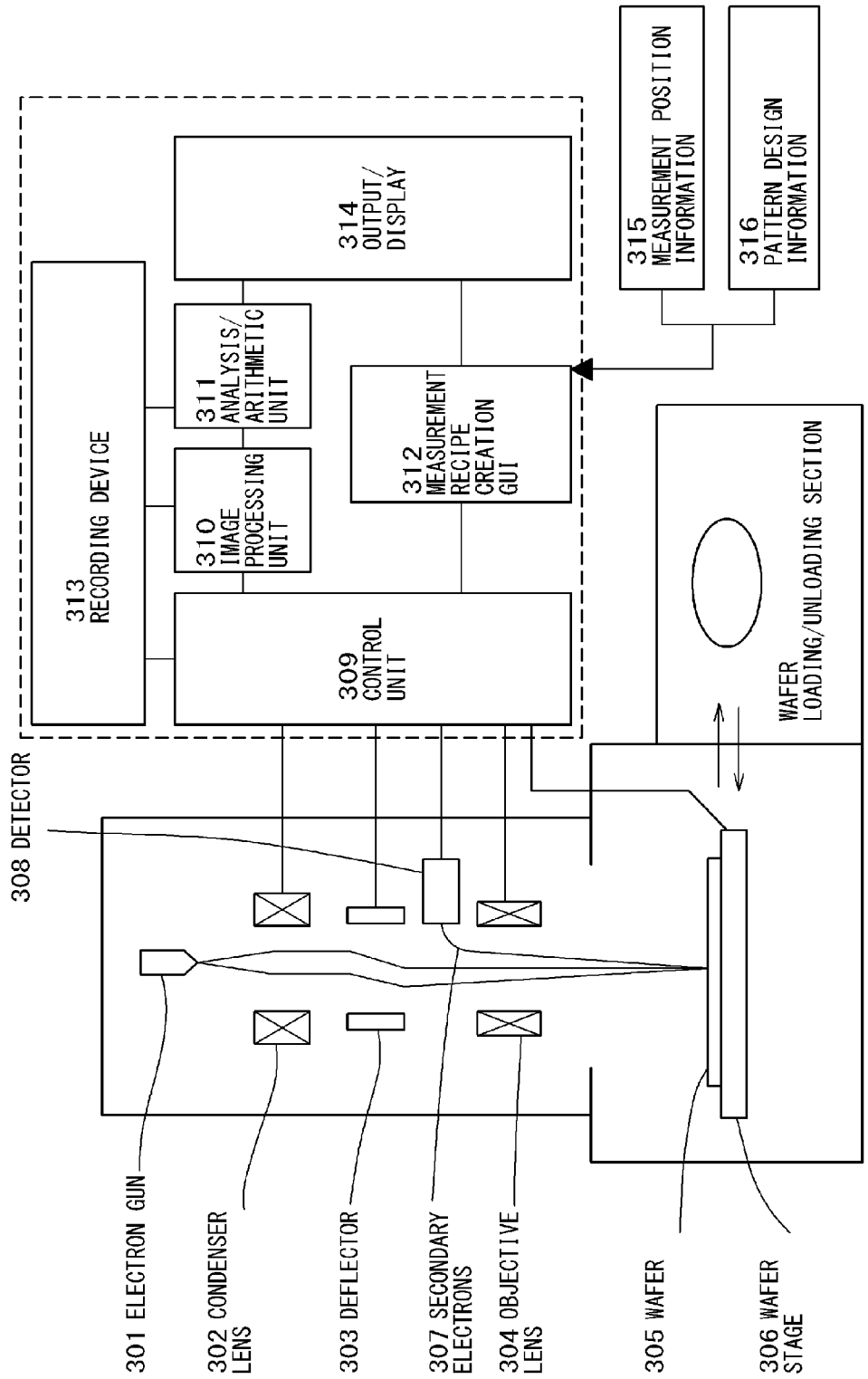

F I G. 5 (a)
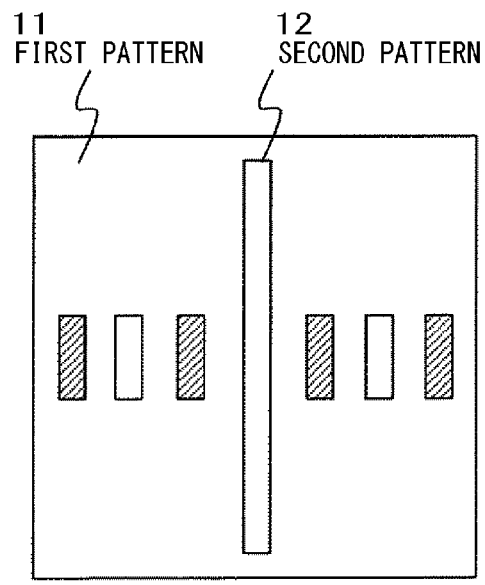
11 FIRST PATTERN
12 SECOND PATTERN
F I G. 5 (b)
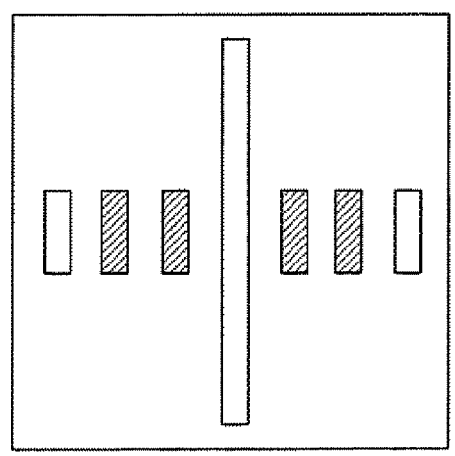

F I G . 5 (c)
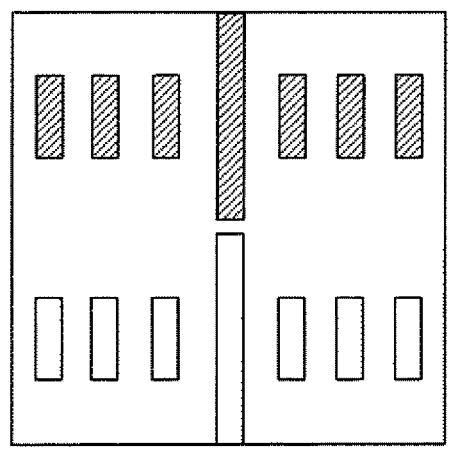
F I G . 5 (d)
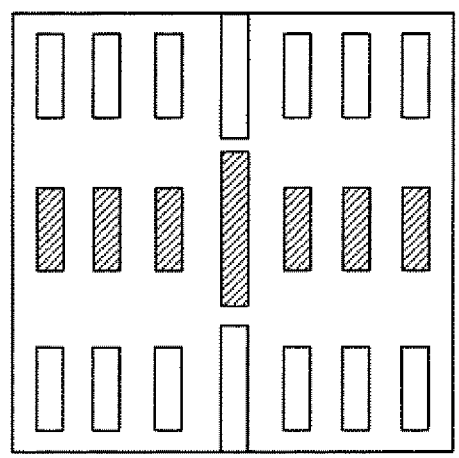

FIG.7 (c)
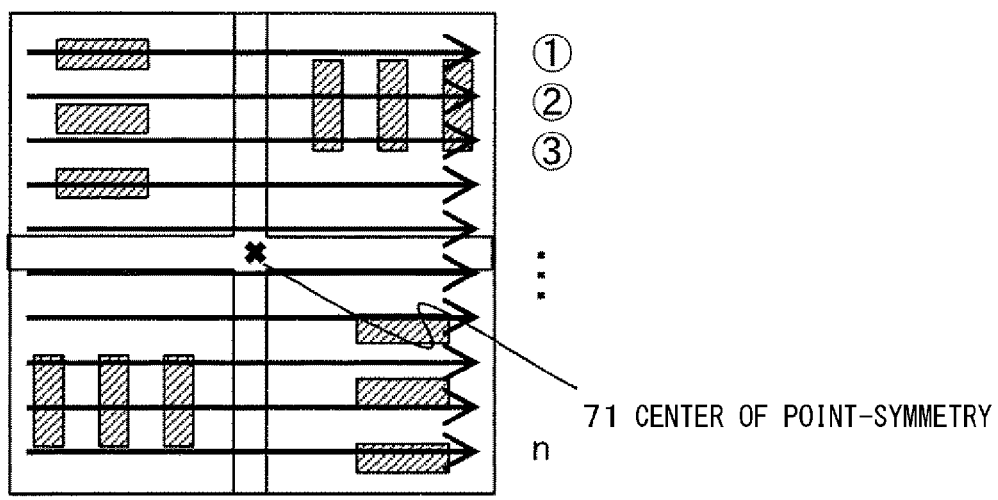
m-th FRAME
71 CENTER OF POINT-SYMMETRY
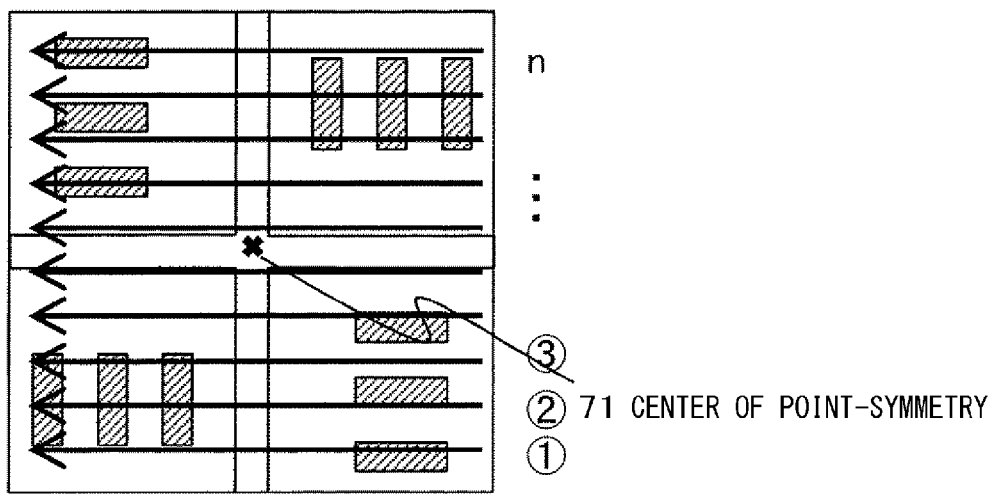
(m+1)th FRAME
71 CENTER OF POINT-SYMMETRY

DIRECTION OF OVERLAY MISALIGNMENT MEASUREMENT (X)

MEASUREMENT SYSTEM AND MEASUREMENT METHOD

TECHNICAL FIELD

The present invention relates to a measurement system and a measurement method using charged particle beams.

BACKGROUND ART

As semiconductor devices are scaled down, dimensional and overlay precisions for required patterns become stricter and requirements for those measurement precisions become stricter, accordingly. According to the International Technology Roadmap for Semiconductors (ITRS), for example, the overlay precision of 8 to 10 nm is required for logic 22 nm nodes (interconnect lines HP 40 nm), and the overlay precision of 6 to 8 nm is required for logic 15 nm nodes (interconnect lines HP 32 nm). Furthermore, the double patterning process is applied to nodes after the logic 22 nm nodes. In this case, the overlay precision has an influence on the dimensional precision; therefore, the overlay precision between double patterning patterns becomes quite strict to be equal to or smaller than 5 nm. To meet this overlay requirement, a high-precision overlay measurement technique is necessary. If Precision/Tolerance (P/T) is assumed as 0.2, the necessary measurement precision is 5 nm×0.2=1.0 nm. Note that this measurement precision represents not only a repeatable/reproducible precision but also comprehensive measurement uncertainty including the absolute value precision and reproducible precision of measurement values.

As the overlay measurement technique, the optical measurement technique has been conventionally, widely used. In the optical measurement, an overlay measurement-dedicated pattern at a size of approximately 20 to 40 µm is necessary and the pattern has been normally inserted into a dicing region in a corner of a chip because of the size. As a result, the overlay measurement-dedicated pattern is apart from an on-chip actual device region, and there occurs approximately a few nm of an overlay measurement value error resulting from the difference in on-chip position and the difference between a position measurement-dedicated pattern and an actual pattern. Since this error is not allowed for the nodes after the 22 nm nodes, it is necessary to measure the overlay near the on-chip device. Furthermore, as regards on-chip overlay distribution correction, only linear components have been conventionally corrected using chip four-corner data. However, as the precision improves, it becomes indispensable to correcting higher-order components, and multipoint measurement including the on-chip overlay measurement becomes necessary on a product mask.

Recently, a measurement scheme with a measurement pattern made small in size has been developed so that the measurement pattern can be disposed near an actual device in the optical measurement technique. This scheme has, however, the following problems. The edge length of the measurement pattern is reduced, and the random variation reduction effect derived from the signal averaging effect is reduced as a result of the shorter edges, so that the measurement precision degrades. In this case, if the size of the measurement pattern is equal to or smaller than 10 µm, the measurement precision required for the nodes after the 22 nm nodes cannot be achieved. On the other hand, if the size of the measurement pattern is equal to or larger than 10 µm, the placement of the measurement pattern near the actual device is limited.

To solve the abovementioned problems, the overlay measurement technique using electron beams has been developed as an alternative for the optical measurement technique. As a typical example of the overlay measurement technique, there is known a technique using a scanning electron microscope (CD-SEM). With the overlay measurement technique using electron beams, a measurement pattern can be made small in size or an actual device itself can be measured. It is, therefore, possible to measure the overlay in the actual device region.

With the overlay measurement using the abovementioned scanning electron microscope, if a first pattern and a second pattern for measuring overlay misalignment are both present on a substrate surface, relative positions of the two patterns can be measured using secondary electron signals by a shape contrast similarly to the normal critical dimension. On the other hand, if the second pattern is not present on the substrate surface but buried in a lower layer, for example, a substrate is electrically charged by irradiating the substrate with electron beams at a higher acceleration and higher current than the normal critical dimension and a voltage contrast resulting from a difference in the structure of the lower layer is detected. It is thereby possible to detect the position of the lower layer pattern, as disclosed in Patent Literatures 1 and 2. However, as disclosed in Patent Literature 1, if the electron beams are scanned in the same direction as a direction of the overlay misalignment measurement, a signal waveform becomes asymmetrical due to the asymmetry of an amount of electric charge along an electron beam scan direction, resulting in the occurrence of an offset in an overlay misalignment measurement result. FIG. 1(a) shows this example.

Next, as disclosed in Patent Literature 2, if electron beams are scanned in a direction perpendicular to the direction of overlay misalignment measurement, the asymmetry of the amount of electric charge along the electron beam scan direction does not cause an offset in the direction of overlay misalignment measurement. It is, therefore, possible to reduce the measurement offset. FIG. 1(b) shows this example. Moreover, FIGS. 2(a) and 2(b) show situations where asymmetrical electric charge occurs in the lower layer pattern section in the electron beam scanning in FIGS. 1(a) and 1(b), respectively. When the inventors measured the overlay misalignment by inverting the scan direction and the scan sequence in order to evaluate the measurement offset in the measurement as shown in FIG. 1(b), a measurement value error of approximately 1 nm was generated. This is because the asymmetry of the amount of electric charge occurs due to the scan sequence and an offset occurs in the direction of overlay misalignment measurement as shown in FIG. 2(b). Furthermore, Patent Literature 2 discloses, as a conventional technique, a scheme for changing a scan method between a central portion of the scan region and a peripheral portion thereof in order to make uniform amounts of electric charge within an electron beam scan region and to suppress a potential gradient. In addition, Patent Literature 2 discloses, as a conventional technique, a method and an apparatus for changing a scan viewpoint in the direction perpendicular to each scan line by a predetermined amount in a predetermined direction in order to suppress the amount of electric charge inherent in the scan method and generated by scanning of an electron beam across one frame. However, the techniques of Patent Literature 2 have the same problems that the signal waveform becomes asymmetrical due to the asymmetry of the amount of electric charge based on the electron beam scanning.

PRIOR ART LITERATURE

Patent Literature

Patent Literature 1: JP-2000-243695-A
Patent Literature 2: JP-2001-189263-A

SUMMARY OF THE INVENTION

Problem to be Solved by the Invention

Overlay misalignment measurement offsets generated depending on the scan directions and/or scan sequences of the electron beams are cancelled by making the scan directions and/or the scan sequences symmetrical, thereby improving overlay measurement precision.

As described above, with the scheme for measuring the position of the lower layer pattern by detecting the voltage contrast by electric charge, offsets are generated in overlay misalignment measurement values depending on the scan directions and/or the scan sequences of electron beams. Patent Literature 1 discloses reducing the asymmetry of signals related to the scan directions and reducing the measurement offsets in the scan directions by the method of scanning the electron beams while alternately changing the scan directions. However, with the scheme, the asymmetry related to the scan directions can be reduced but the asymmetry resulting from the scan sequences remains in the directions perpendicular to the scan direction. As a result, the measurement offsets remains in the directions. In a case of the overlay misalignment measurement only in one direction, the measurement offsets in this direction can be reduced by scanning the electron beams in the same direction as the direction of overlay misalignment measurement and alternately changing the scan directions. However, if the measurement is to be made in two directions simultaneously, the measurement offsets remain in the direction where the asymmetry of the amount of electric charge resulting from the scanning sequences remains. Moreover, as disclosed in Patent Literature 2, if the electron beam is scanned in the direction perpendicular to the direction of overlay misalignment measurement, the asymmetry of the amount of electric charge along the electron beam scan direction does not cause offsets in the direction of overlay misalignment measurement and the measurement offsets can be reduced. As already described above, however, the measurement offsets remain due to the influence of the asymmetry of the amount of electric charge resulting from the scan sequences.

On the other hand, if a scan condition for reducing the amount of electric charge by low-current scan, fast scan or the like in order to reduce the asymmetry of the amount of electric charge, the influence of the asymmetry of the amount of electric charge can be reduced. However, because of the need to detect the voltage contrast resulting from the difference in the structure of the lower layer, the S/N ratio of position detection signals for the lower layer pattern degrades and the measurement precision degrades.

If the voltage contrast due to the electric charge is detected and the position of the lower layer pattern is measured, the resolution for detecting the lower layer pattern degrades. Owing to this, it is difficult to measure a fine lower layer pattern of, for example, 100 nm or smaller although it depends on the structure of the substrate. As a result, it is necessary to set a large size for the measurement pattern to a certain degree. For example, in the examples of waveforms shown in FIGS. 4(a) and 4(b), the sizes of the patterns are 200 nm. Generally, a very high S/N ratio cannot be obtained with the voltage contrast due to the electric charge; therefore, it is necessary to emit more electron beams than those for the normal critical dimension. As a result, the problem of the reduction of measurement throughput also occurs. In these circumstances, it is necessary to make measurement in the X and Y directions simultaneously. In that case, the conventional techniques cannot reduce the measurement offsets resulting from the asymmetry of the amount of electric charge resulting from the scan directions and the scan sequences two-dimensionally (in the X and Y directions simultaneously), and it is difficult to make the high-precision measurement in the X and Y directions simultaneously.

The present invention has been made to solve the above-mentioned problems. It is an object of the present invention to provide a scanning electron microscope, a measurement system including the scanning electron microscope, and a measurement method capable of scanning electron beams and measuring overlay misalignment two-dimensionally (in X and Y directions simultaneously).

Means for Solving the Problem

To achieve the abovementioned object, a measurement system of the present invention includes: a condition setting unit determining a scan direction or scan sequence condition on the basis of a preset arbitrary axis or point within a scan region; an image processing unit adding up regions symmetrical with each other within the scan region in an image obtained by scanning charged particle beams over a substrate having a first pattern and a second pattern formed in a step after a step of forming the first pattern, the scanning being performed on the basis of the scan direction or scan sequence condition determined by the condition setting unit; and an arithmetic unit computing, on the basis of the addition result, an overlay between the first pattern and the second pattern formed in the step after the step of forming the first pattern on the substrate.

Furthermore, the measurement method of the present invention includes: a condition setting step of determining a scan direction or scan sequence condition on the basis of a preset arbitrary axis or point within a scan region; an image processing step of adding up regions symmetrical with each other within the scan region in an image obtained by scanning charged particle beams over a substrate having a first pattern and a second pattern formed in a step after a step of forming the first pattern, the scanning being performed on the basis of the scan direction or scan sequence condition determined by the condition setting unit; and an arithmetic step of computing, on the basis of the addition result, an overlay between the first pattern and the second pattern formed in the step after the step of forming the first pattern on the substrate.

Effect of the Invention

According to the present invention, it is possible to provide the measurement system and the measurement method capable of cancelling measurement offsets and reducing measurement errors.

BRIEF DESCRIPTION OF THE DRAWINGS

FIG. 3 is a schematic diagram of a scanning electron microscope according to a first embodiment.

FIG. 5(a) shows an example of a pattern for measuring overlay misalignment in one direction.

FIG. 5(b) shows an example of a pattern for measuring overlay misalignment in one direction.

FIG. 5(c) shows an example of a pattern for measuring overlay misalignment in one direction.

FIG. 5(d) shows an example of a pattern for measuring overlay misalignment in one direction.

MODES FOR CARRYING OUT THE INVENTION

Figure 1:
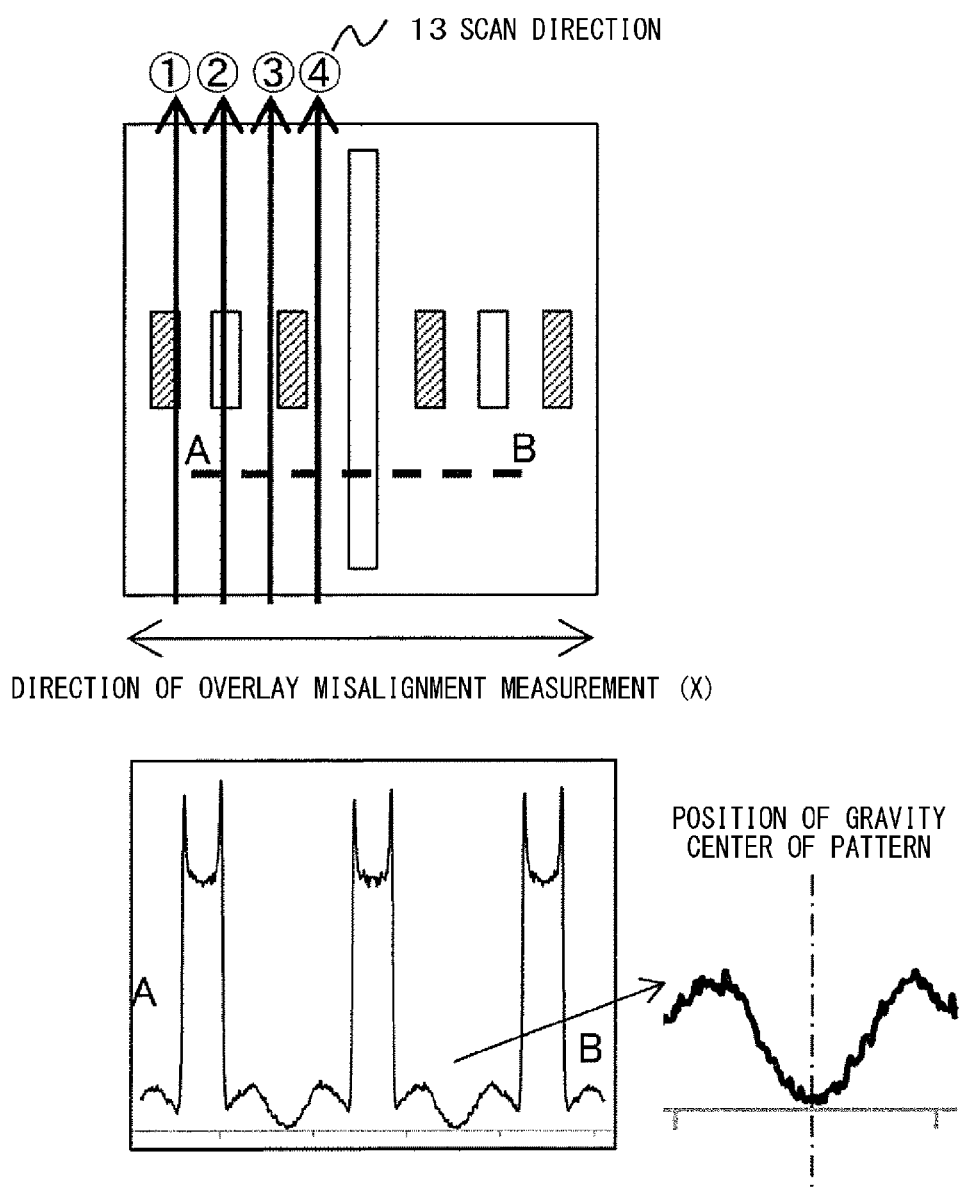
FIG. 1(a) shows an example of a signal waveform in a case of scanning electron beams in order to measure overlay misalignment, the electron beams being scanned in the same direction as a direction of overlay misalignment measurement.
FIG. 1(b) shows an example of a signal waveform in a case of scanning electron beams in order to measure overlay misalignment, the electron beams being scanned in a direction perpendicular to the direction of overlay misalignment measurement.
Figure 2:
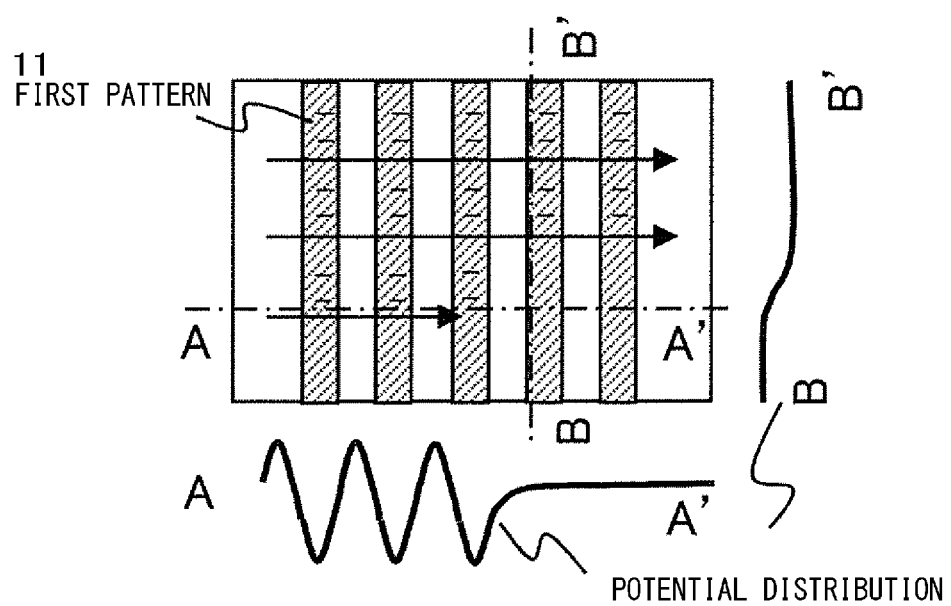
FIG. 2(a) shows an example of a potential distribution generated in a case of scanning electron beams in a location where a lower layer pattern is present, the electron beams being scanned in the same direction as the direction of overlay misalignment measurement.
FIG. 2(b) shows an example of a potential distribution generated in a case of scanning electron beams in the location where the lower layer pattern is present, the electron beams being scanned in the direction perpendicular to the direction of overlay misalignment measurement.

Embodiments of the present invention will be described hereinafter with reference to the drawings.

According to the present invention, measurement offsets in relative position measurement between a first pattern and a second pattern generated in each of a plurality of pattern position measurement regions defined within an electron beam scan region are symmetrical. This is because scan directions and scanning sequences of electron beams are symmetrical between the pattern position measurement regions. Owing to this, in a final measurement result obtained by the arithmetic average of overlay measurement values measured in the pattern position measurement regions, the measurement offsets are cancelled and the influence of the measurement offsets is reduced. Furthermore, according to the present invention, the scan directions and scan sequences of the electron beams are made point-symmetrical between the pattern position measurement regions, thereby making it possible to measure overlay misalignment two-dimensionally (in X and Y directions, simultaneously). Therefore, according to the present invention, it is possible to make a measurement pattern small in size and improve measurement throughput by the simultaneous measurement in the X and Y direction.

First Embodiment

FIG. 3 is a block diagram showing an overall schematic configuration of a scanning electron microscope according to a first embodiment of the present invention. Primary electron beams emitted from an electron gun 301 are passed through a condenser lens 302 and a deflector 303 and narrowed down on a wafer 305 on a wafer stage 306 by an objective lens 304. The primary electron beams strike against a sample in a fine region on the wafer to generate secondary electrons 307 or reflected electrons. Secondary electron signals are mainly used in a case of observing a surface shape, and a detector 308 detects the secondary electron signals. The deflector 303 scans the electron beams over the sample two-dimensionally and an image corresponding to the surface shape of the sample is formed. A control unit 309 controls the condenser lens 302, the objective lens 304, the deflector 303, the detector 308, and the like.

The obtained image is subjected to a necessary noise removal process and the like by an image processing unit 310 and then to edge point extraction and the like by a signal analysis/arithmetic unit 311, and necessary measurement is carried out. A result of the measurement is recorded in a recording device 313 and displayed on an output/display 314.

To create a measurement recipe for specifying a measurement sequence, it is necessary to set parameters including coordinates on the wafer, a shape and a type of a measurement pattern, an electron beam scan region, a scan direction, a scan sequence, and an algorithm for use in the measurement. While the setting of these parameters can be made manually by inputting these parameters, for example, to a measurement recipe creation GUI, the setting can be automated by referring to external measurement position information 315 and external pattern design information 316. In this way, a measurement recipe creation GUI 312 also serves as a condition setting unit for setting the parameters such as the algorithm described above.

Figure 4:
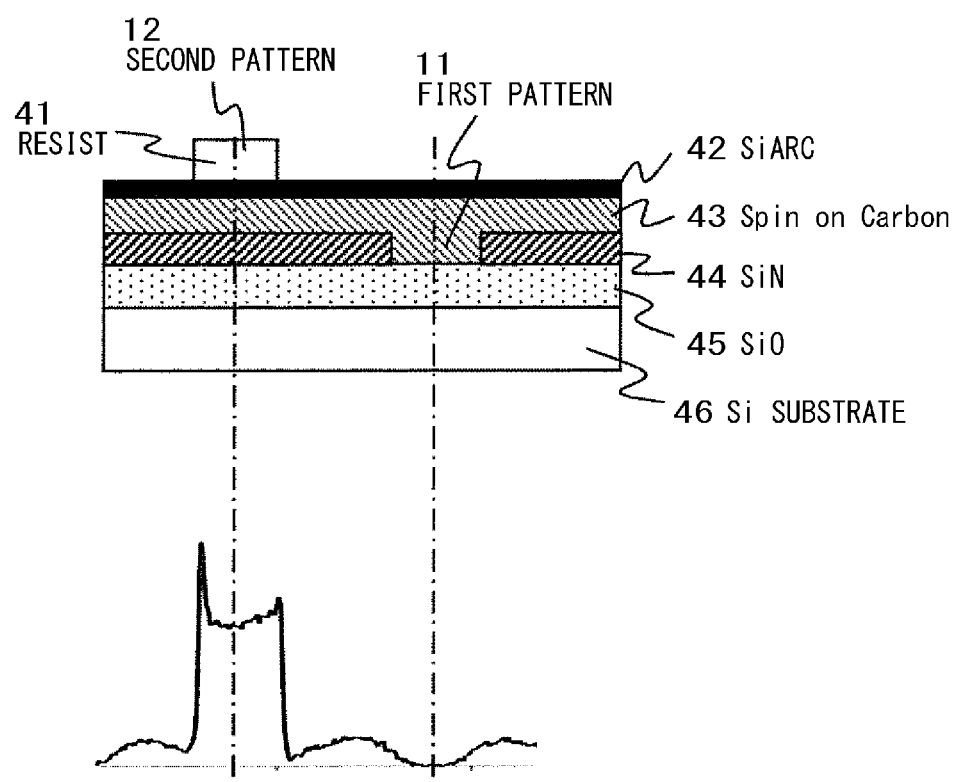
FIG. 4(a) shows an example of a cross-sectional structure of a pattern having a first pattern and a second pattern for measuring the misalignment according to the first embodiment, the misalignment being determined by comparing relative positions of the first and second patterns with reference values.
FIG. 4(b) shows an example of a cross-sectional structure of the pattern having a first pattern and second patterns for measuring the misalignment according to the first embodiment, relative positions of the first pattern and the respective second patterns being measured to determine the misalignment from the difference.
Figure 4:
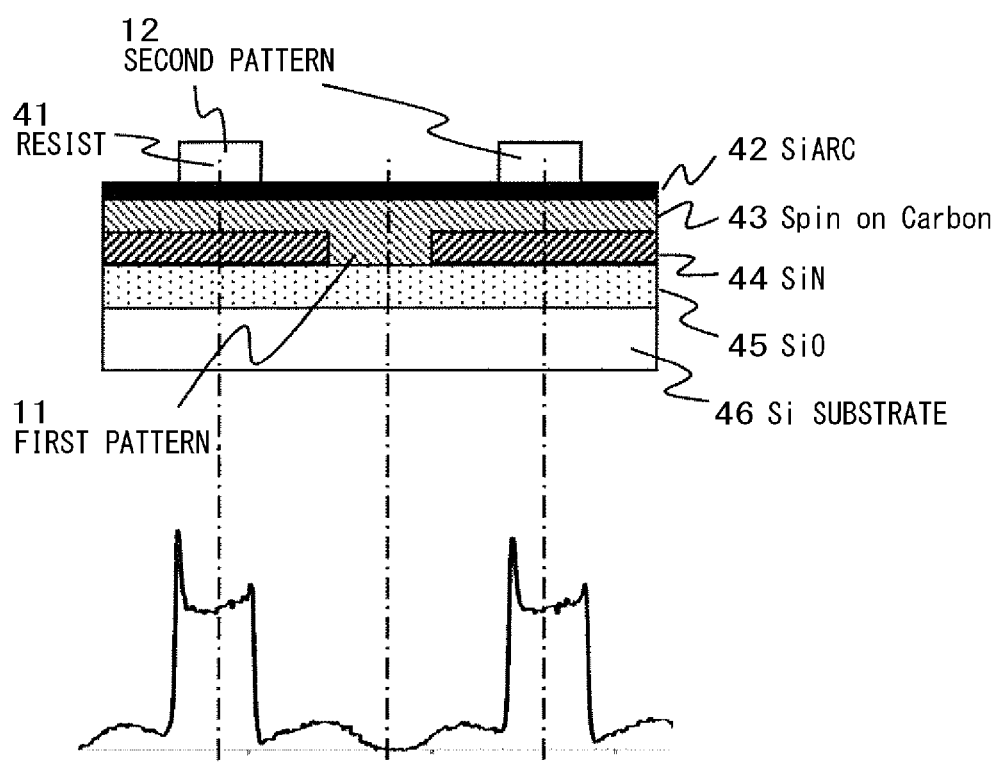

Next, FIGS. 4(a) and 4(b) each show a substrate structure where overlay misalignment measurement according to the present embodiment is to be implemented. There are provided an SiO film 45 which has been formed on an Si substrate 46, and an SiN film 44 which has been formed on the SiO film 45 and in which a first pattern has been processed. Needless to say, the substrate structures shown here are given only for illustrate purposes and the present invention is applicable to a structure sharing the same object to be achieved with the substrate structure shown therein. FIG. 4(a) and FIG. 4(b) are each a cross-sectional view in a lithography step of forming a second pattern 12, while showing that a first pattern 11 is formed in a step before the lithography step of forming the second pattern 12. In the lithography step, a foundation is planarized, a Spin on Carbon film 43 which serves as a lower-layer-pattern etching mask is coated on the foundation, an Si-containing anti-reflection film (SiARC) 42 is then coated, a resist 41 is finally coated, and the second pattern is then exposed and developed. In the double patterning process applied to the process for nodes after the 22 nm nodes, for example, the first pattern 11 is formed between the second patterns 12 as shown in FIG. 4(b), thereby making it possible to narrow pitches for a pattern formed by the first and second patterns. At this time, required values for the overlay misalignment between the first pattern and each of the second patterns becomes quite strict, so that it is necessary to measure and manage the overlay misalignment with high precision. The signal waveforms shown in FIGS. 4(a) and 4(b) are obtained when an acceleration voltage of the electron beams has been set to 4 kV and a probe current has been set to 40 pA.

The second pattern 12 is a resist pattern 41 present on a substrate surface and a signal due to a shape contrast being detected therefrom similarly to the conventional critical dimension. In this case, pattern edges are determined by, for example, a threshold approach, and a position of the pattern can be defined as a point of center of gravity of edge positions determined by the pattern edges. Alternatively, the position of the pattern may be defined by the other algorithm. In another alternative, if the second pattern 12 has a two-dimensional complex shape, a profile line of a two-dimensional resist shape is extracted and the position of the pattern can be defined by the position of the center of gravity of a graphic defined by the extracted profile line, for example. Next, a position of the first pattern 11 in the lower layer can be determined from the voltage contrast signals shown in FIGS. 4(a) and 4(b) by using an electric charge contrast. Similarly to the second patterns 12, pattern edges may be defined for the first pattern 11. Alternatively, a method of fitting the entire signals into a reference waveform or searching a center of symmetry of signal parts of the second patterns is applicable to the measurement of the positions of the second pattern. By defining the pattern positions for the first pattern 11 and the second pattern 12 as described above, relative positions of the first pattern 11 and the second pattern 12 can be calculated.

A method of calculating the overlay misalignment from the measured relative positions will next be described. With the structure of FIG. 4(a), the overlay misalignment can be measured by measuring the relative positions of the first pattern 11 and the second pattern 12 and calculating misalignment amounts of the relative positions from reference values or design values. With the structure of FIG. 4(b), the relative positions of the first pattern 11 and the second patterns 12 are similarly measured. In the case of FIG. 4(b), the overlay misalignment can be measured not by calculating the misalignment amounts of the relative positions from the reference values but from ½ of a difference between the distance from the first pattern 11 to the right second pattern 12 and the distance from the first pattern 11 to the left second pattern 12 because these distances are equal in the design.

FIGS. 5(a) and 5(b) each show an example of the measurement in one direction for the layout of the pattern used in the overlay misalignment measurement. The first patterns 11 and the second patterns 12 may be alternately disposed. However, because of the low S/N ratio of signals from the first patterns in the lower layer, more first patterns may be disposed as shown in FIG. 5(b). Alternatively, as shown in FIGS. 5(c) and 5(d), the first patterns 11 and the second patterns 12 may be disposed in regions divided in the electron beam scan region. By doing so, it is possible to prevent the signals from the first patterns 11 from becoming asymmetrical due to the influence of electric charge that is markedly generated if the second patterns are formed from an insulator such as the resist. By disposing the first patterns 11 and the second patterns 12 as shown in FIG. 5(d), it is possible to measure the relative positions of the first patterns 11 and the second patterns 12 with high precision without the influence of a rotational error even when the error occurs to the acquired CD-SEM image. In these patterns, the positions of center of gravity of the first patterns and the second patterns are calculated, respectively as described with reference to FIGS. 4(a) and 4(b), obtained coordinates are averaged over the first patterns or the second patterns, and a position of a center of gravity of the overall first patterns and a position of a center of gravity of the overall second patterns can be calculated. The relative positions can be calculated from the difference between the positions of the centers of gravity. As described with reference to FIGS. 4(a) and 4(b), the overlay misalignment amount can be calculated by, for example, measuring misalignment amounts of the obtained relative positions from the reference positions. Alternatively, similarly to the cases of FIGS. 4(a) and 4(b) where the overlay misalignment can be measured from ½ of the difference between the distance from the first pattern to the right second pattern and the distance from the first pattern to the left second pattern because these distances are equal in the design, the overlay misalignment amount may be calculated from the misalignment amounts of the positions of the centers of gravity of the first patterns and the second patterns because the position of the center of gravity of the first patterns matches that of the second patterns in the symmetrical measurement patterns.

Figure 6:
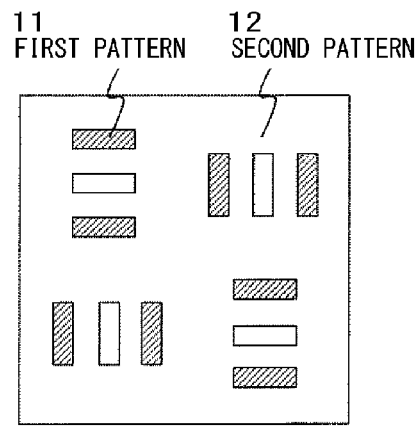
FIG. 6(a) shows an example of a pattern for measuring overlay misalignment simultaneously in two directions.
FIG. 6(b) shows an example of a pattern for measuring overlay misalignment simultaneously in two directions.
FIG. 6(c) shows an example of a pattern for measuring overlay misalignment simultaneously in two directions.
Figure 6:
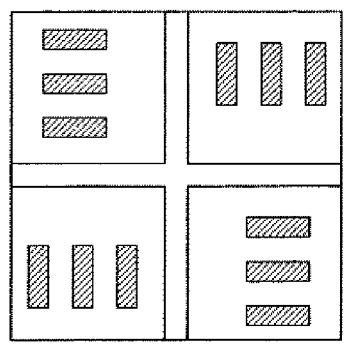
Figure 6:
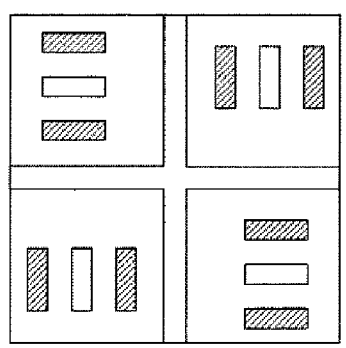

Next, FIGS. 6(a) and 6(b) each show an example of measurement patterns in X and Y directions simultaneously. As shown in FIGS. 6(a) to 6(c), by the point-symmetrical layout of the measurement patterns, it is possible to measure the relative positions of the first patterns 11 and the second patterns 12 with high precision without the influence of a rotational error or a magnification error in the CD-SEM image. Furthermore, similarly to the measurement patterns in one direction, the first patterns and the second patterns may be disposed alternately. However, because of the low S/N ratio of signals from the first patterns in the lower layer, more first patterns may be disposed. Moreover, similarly to the measurement patterns in one direction, by disposing the first patterns and the second patterns in regions divided in the electron beam scan region, it is possible to prevent the signals from the first patterns from becoming asymmetrical due to the influence of electric charge that is markedly generated if the second patterns are formed from the insulator such as the resist.

While the examples of the overlay misalignment measurement patterns have been described with reference to FIGS. 5(a) to 5(d) and FIGS. 6(a) to 6(c), the overlay misalignment may be measured using semiconductor circuit patterns.

Figure 7:
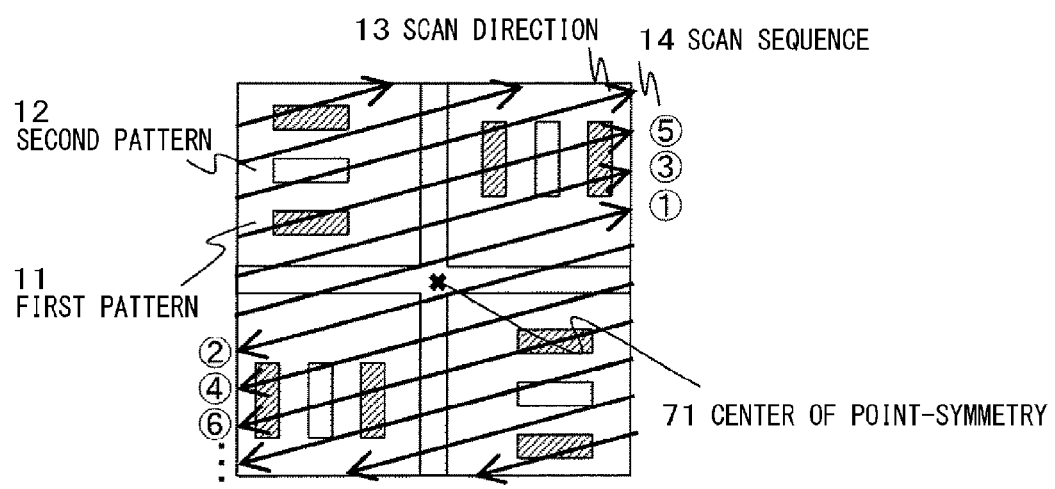
FIG. 7(a) shows scan directions and scan sequences of electron beams according to a first embodiment.
FIG. 7(b) shows scan directions and scan sequences of electron beams according to the first embodiment.
FIG. 7(c) shows scan directions and scan sequences of electron beams according to a third embodiment.
Figure 7:
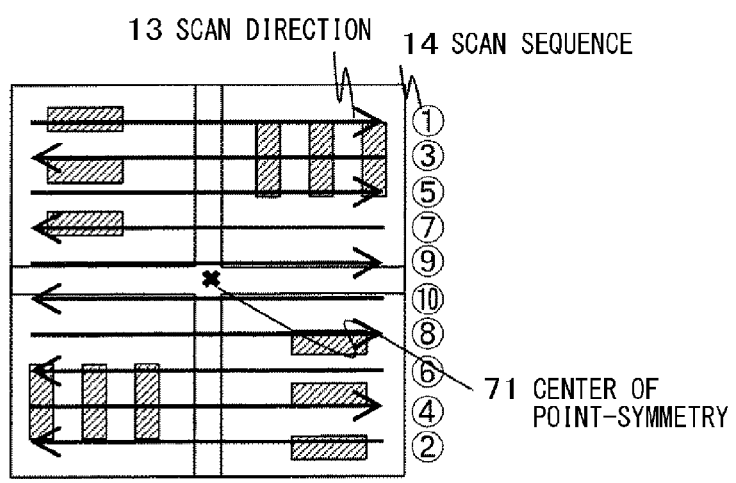
Figure 9:
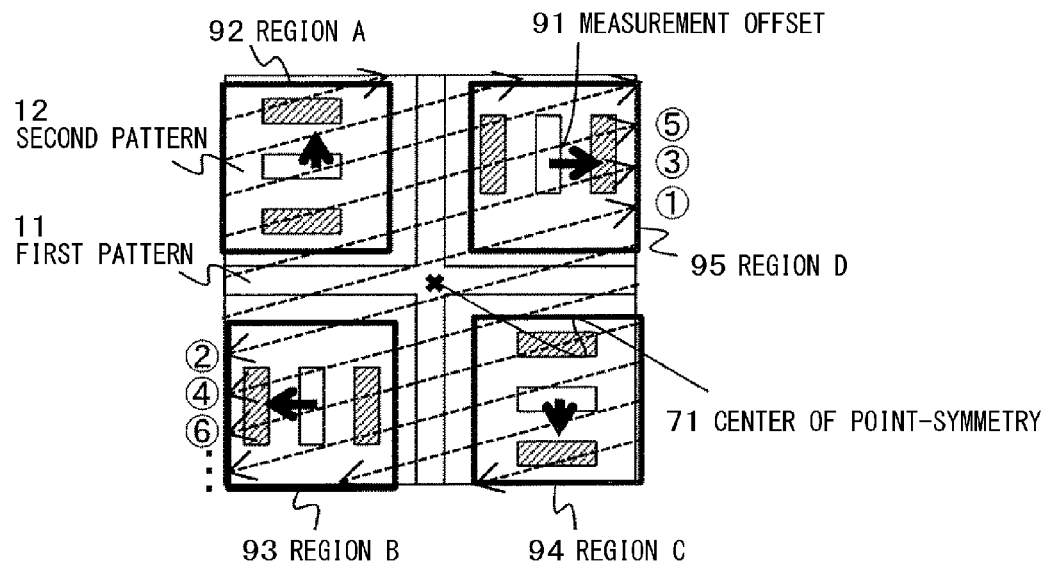
FIG. 9(a) shows an example of a measurement offset distribution in a plurality of measurement regions defined within an electron beam scan region, the measurement offset distribution being according to the first embodiment.
FIG. 9(b) shows an example of a measurement offset distribution in a plurality of measurement regions defined within an electron beam scan region, the measurement offset distribution being according to the second embodiment.
Figure 9:
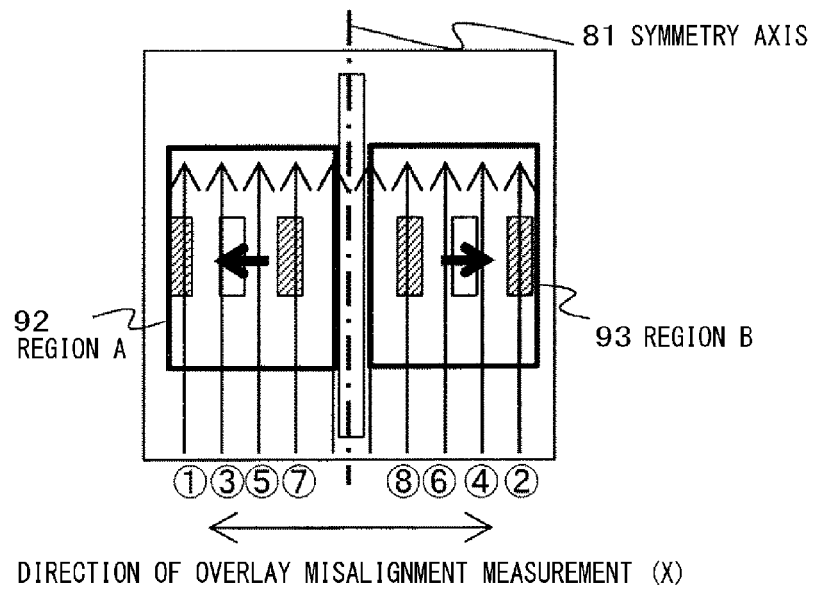

Next, FIGS. 7(a) and 7(b) each show a scan method for scanning the electron beams according to the present embodiment. As already described, the asymmetry of the amount of electric charge occurs due to the scan method or scan sequence of the electron beams. As a result of the asymmetry, overlay measurement offsets are generated. To reduce the measurement offsets, the electron beams are scanned in such a manner that scan directions 13 and scan sequences 14 of the electron beams are symmetrical about a center of point-symmetry 71 shown in FIGS. 7(a) and 7(b). In FIG. 7(a), the electron beam scan direction is made to form an angle on purpose with respect to the X-axis so as to prevent the reduction in the contrast of signals from pattern edges in parallel to the X-axis even if the second patterns 12 are present on the wafer surface. Furthermore, FIG. 7(a) does not concern a scan scheme for canceling the asymmetry of the waveform by alternately changing the scan directions as disclosed in Patent Literature 1. Namely, the measurement offsets are generated due to the asymmetry of the waveform on upper and lower sides in the scan region. However, the measurement offsets on the upper side and the lower side become symmetrical by symmetrically scanning the electron beams in the scan direction and the scan sequences, and the measurement offsets are cancelled and do not result in measurement errors by averaging amounts of overlay misalignment measured on the upper and lower sides. Referring next to FIG. 7(b), the scan directions 13 are alternately changed; however, the electron beams are scanned symmetrically about the center of point-symmetry in the scan sequences which are not disclosed in Patent Literature 1. Also in this case, the measurement offsets are generated on the upper and lower sides in the scan region, respectively; however, the measurement offsets can be eventually cancelled. To consider the aforementioned in detail, FIG. 9(a) shows an example of a measurement offset distribution in the scan region. If four measurement regions A, B, C, and D (corresponding to reference symbols 92, 93, 94, and 95, respectively) are defined symmetrically about the center of point-symmetry 71, electron beams are scanned symmetrically about the center of point-symmetry in the regions A and C by applying the scan scheme according to the present embodiment. Likewise, the electron beams are scanned symmetrically about the center of point-symmetry in the regions B and D. When the relative positions of the first patterns and the second patterns are measured, a measurement offset 91 is generated in each of the regions. The measurement offsets 91 are checked and found to be symmetrical in the symmetrical measurement regions as shown in FIG. 9(a). Therefore, in the relative positions calculated by the arithmetic average of the relative positions measured in the measurement regions A to D, the measurement offsets are cancelled and results of high-precision relative position measurement without the measurement offsets can be obtained. With this scan method, it is possible to reduce the measurement offsets generated due to the scan directions and/or the scan sequences of the electron beams. In this case, the measurement offsets can be each reduced to be equal to or smaller than 0.5 nm.

Figure 10:
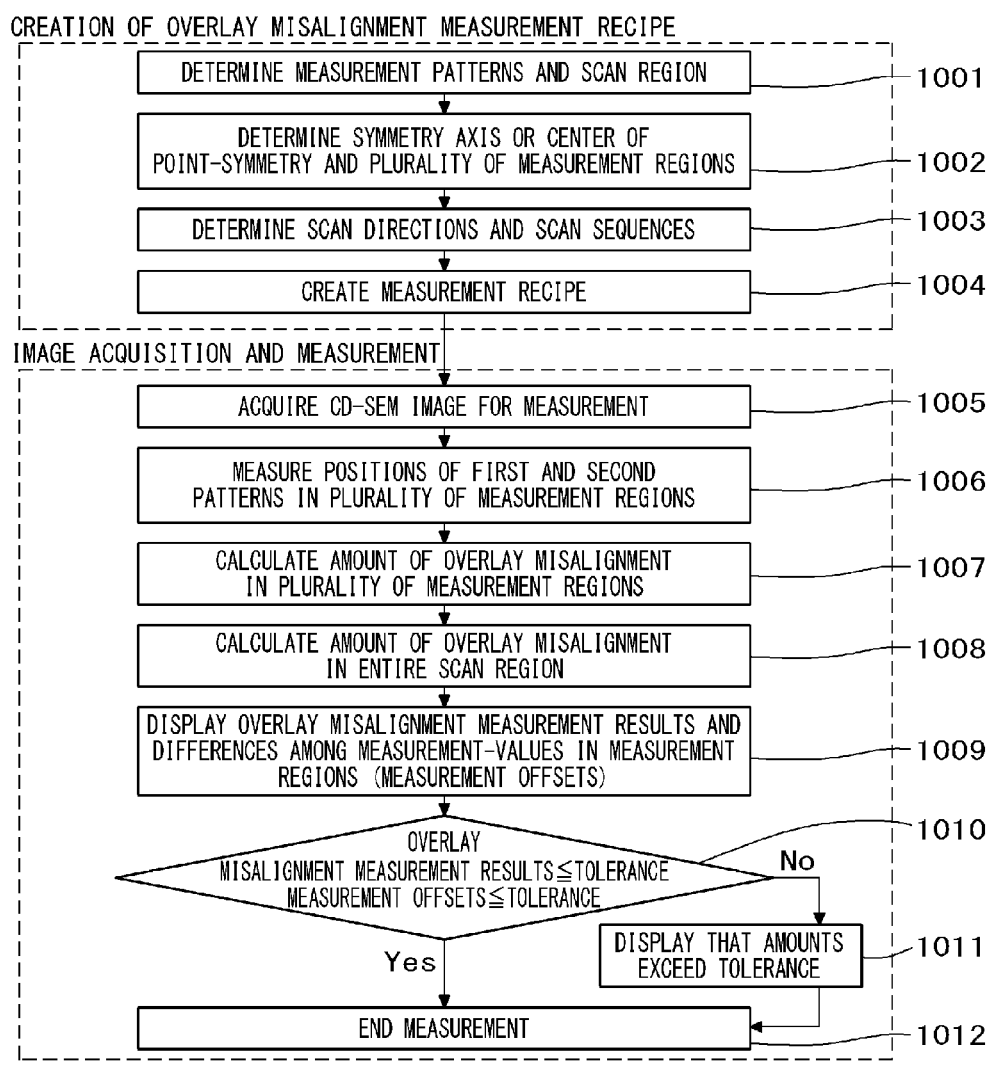
FIG. 10 is a flowchart of overlay misalignment measurement according to the first embodiment.

FIG. 10 is a flowchart of the electron beam scan method according to the present embodiment from the determination to the overlay measurement. First, overlay measurement patterns and the electron beam scan region are determined from the measurement patterns or actual patterns formed on the wafer (1001). At this time, the measurement precision can be improved by making the scan directions and the scan sequences of the electron beams symmetrical and also making the measurement patterns symmetrical. Even if the measurement patterns are not symmetrical within the entire electron beam scan region, it is possible to effectively improve the measurement precision by making the measurement patterns symmetrical in a plurality of measurement regions. Next, the center of point-symmetry in the scan region is determined in the light of the symmetry of the measurement patterns and, at the same time, a plurality of measurement regions as shown in FIG. 9(a) is determined in the scan region (1002). The relative positions of the first patterns and the second patterns may be each calculated in the measurement regions within the scan region. Alternatively, the position of the center of gravity of the first patterns may be determined in the entire measurement regions, the position of the center of gravity of the second patterns may be similarly calculated in the entire measurement regions, and the relative positions of the first patterns and the second patterns may be calculated on the basis of the positions of the centers of gravity. Next, the scan directions and scan sequences of the electron beams are determined so as to be symmetrical about the center of point-symmetry (1003). The other parameters necessary to create the measurement recipe are determined similarly to the creation of the recipe using the normal CD-SEM (1004). Next, the recipe is executed to acquire the CD-SEM image (1005). From the acquired image, the positions of the first and second patterns are measured in the measurement regions (1006). Using those results, the relative positions of the first patterns and the second patterns are determined in the respective measurement regions, and the amount of overlay misalignment is calculated using the relative positions (1007). Next, using the overlay misalignment measurement results in the respective measurement regions, the final amount of the overlay misalignment is calculated (1008). At this time, it is possible to improve the measurement precision because the symmetry of the scan scheme can cancel the measurement offsets that may result in measurement errors. Lastly, the measurement offset amounts that have been calculated from this measurement result and the overlay misalignment measurement results in the respective measurement regions are displayed on a display of the apparatus (1009). Furthermore, if the amounts exceed a tolerance prescribed in advance, a message indicating that the amounts exceed the tolerance is displayed on the display (1010, 1011), and the measurement is ended (1012).

Figure 11:
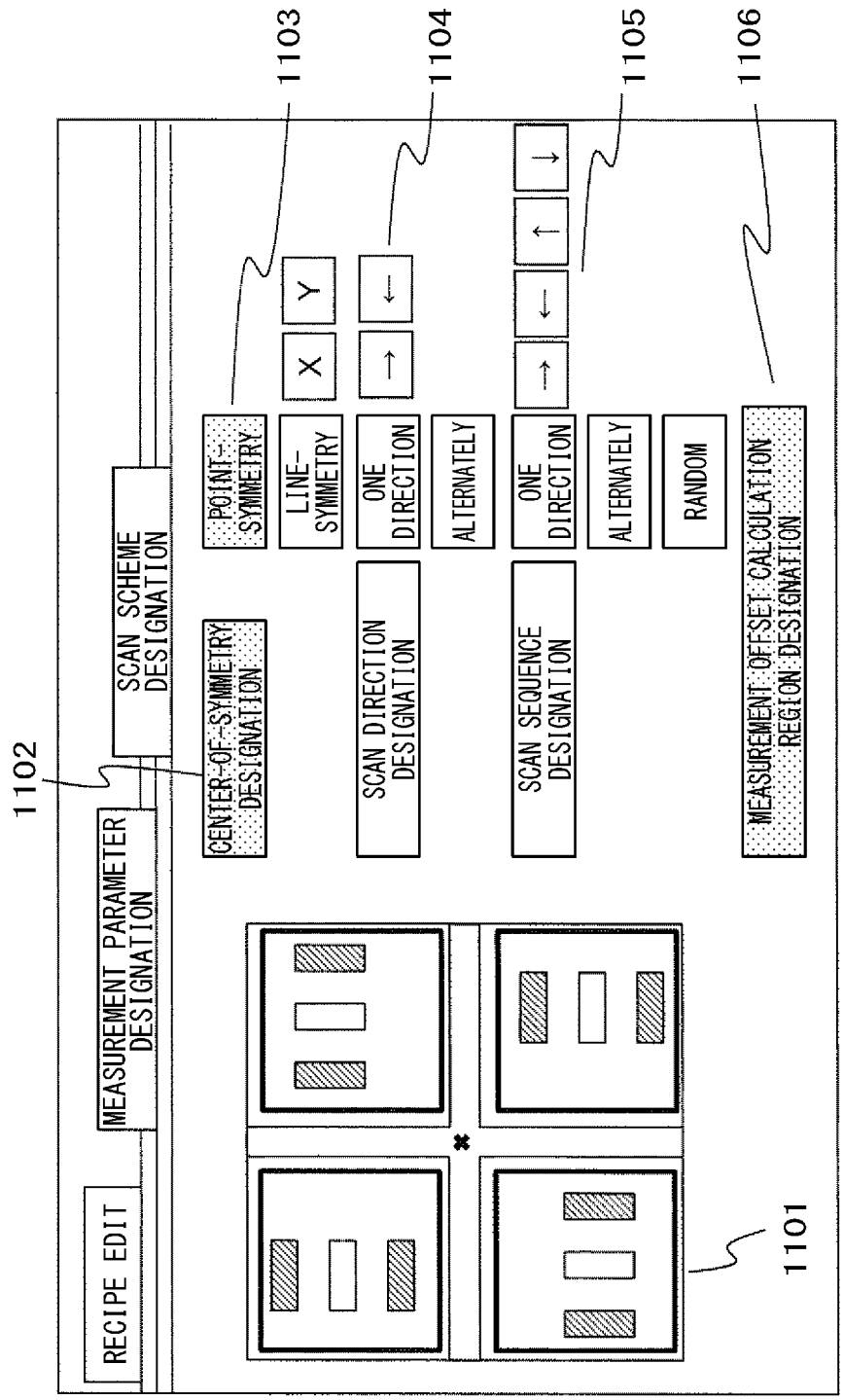
FIG. 11 shows an example of a GUI screen for the setting of a misalignment measurement recipe according to the first embodiment.

Operability for creating the recipe can be improved by creating a setting input portion for determining and inputting the center of symmetry and a plurality of measurement regions, as well as the scan directions, scanning sequences, and the like on a recipe setting screen GUI of the measurement apparatus according to the present embodiment. FIG. 11 shows this example. Menus including those of center-of-symmetry designation (1102), point-symmetry or line-symmetry selection (1103), electron beam scan direction designation (1104), electron beam scan sequence designation (1105), and measurement offset calculation region designation (1106) are prepared. Furthermore, the measurement offset values are output and the distribution of the measurement offset values in the scan region is displayed, thereby making it possible to confirm the effects of the present scheme more easily.

Second Embodiment

Figure 8:
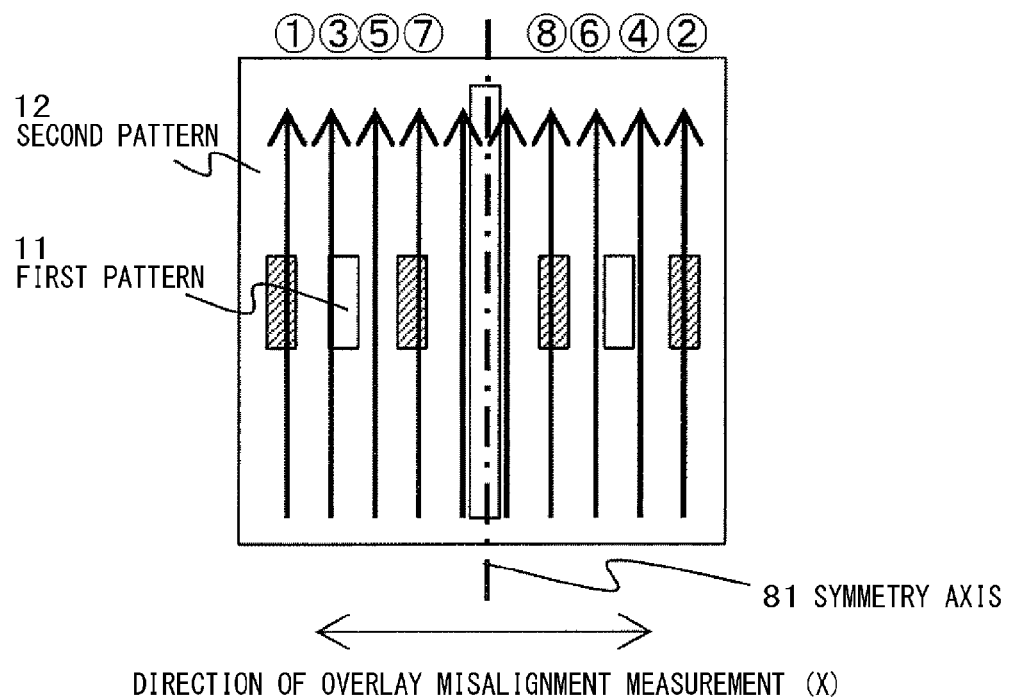
FIG. 8 shows scan directions and scan sequences of electron beams according to a second embodiment.

A second embodiment will be described. While the examples of the measurement in the X and Y directions simultaneously have been described in the first embodiment, the present invention is also applicable to the measurement in one direction. In the case of the measurement in one direction, line-symmetry in place of the point-symmetry may be used as the symmetry. The measurement precision can be improved by, for example, using the measurement patterns as shown in FIGS. 5(a) to 5(d) and by an electron beam scan method as shown in FIG. 8. In the scan method of FIG. 8, electron beams are scanned in a direction orthogonal to the direction of overlay misalignment measurement similarly to the disclosure of Patent Literature 2. However, the electron beams are scanned symmetrically about a symmetry axis in the scan sequence that is not disclosed in Patent Literature 2, thereby making it possible to reduce the measurement offsets in the X direction. FIG. 9(b) shows an example of the distribution of the measurement offsets in the scan region. A plurality of measurement regions A and B is defined. The scan directions and the scan sequences in the measurement regions A and B are symmetrical about a symmetry axis 81 of the line-symmetry. As a result, as shown in FIG. 9(b), symmetrical measurement offsets are generated in the measurement regions A and B, the measurement offsets are cancelled when the amount of overlay misalignment is calculated in the entire scan region, and the measurement offsets have no influence on measurement results. As a result, it is possible to improve overlay measurement precision.

Third Embodiment

In the first and second embodiments, the scan directions and the scanning sequences are made symmetrical in one frame within the scan region. Normally, electron beams are scanned over a plurality of frames and results of the scanning are overlaid to form a CD-SEM image. Therefore, the scan directions and the scanning sequences may be made symmetrical in the light of scanning in the plurality of frames. FIG. 7(c) shows the example. Electron beams are scanned rightward over an m-th frame in sequence from above, and the scan directions and the scan sequences are not symmetrical about the center of point-symmetry 71 in the m-th frame. However, as FIG. 7(c) illustrates an image of the next (m+1)th frame, electron beams are scanned leftward over the (m+1)th frame in sequence from below. As a result, in an image of a combination of the m-th frame and the (m+1)th frame, the scan directions and the scanning sequences become symmetrical. By doing so, it is possible to obtain the same effects as those of the first embodiment.

Figure 12:
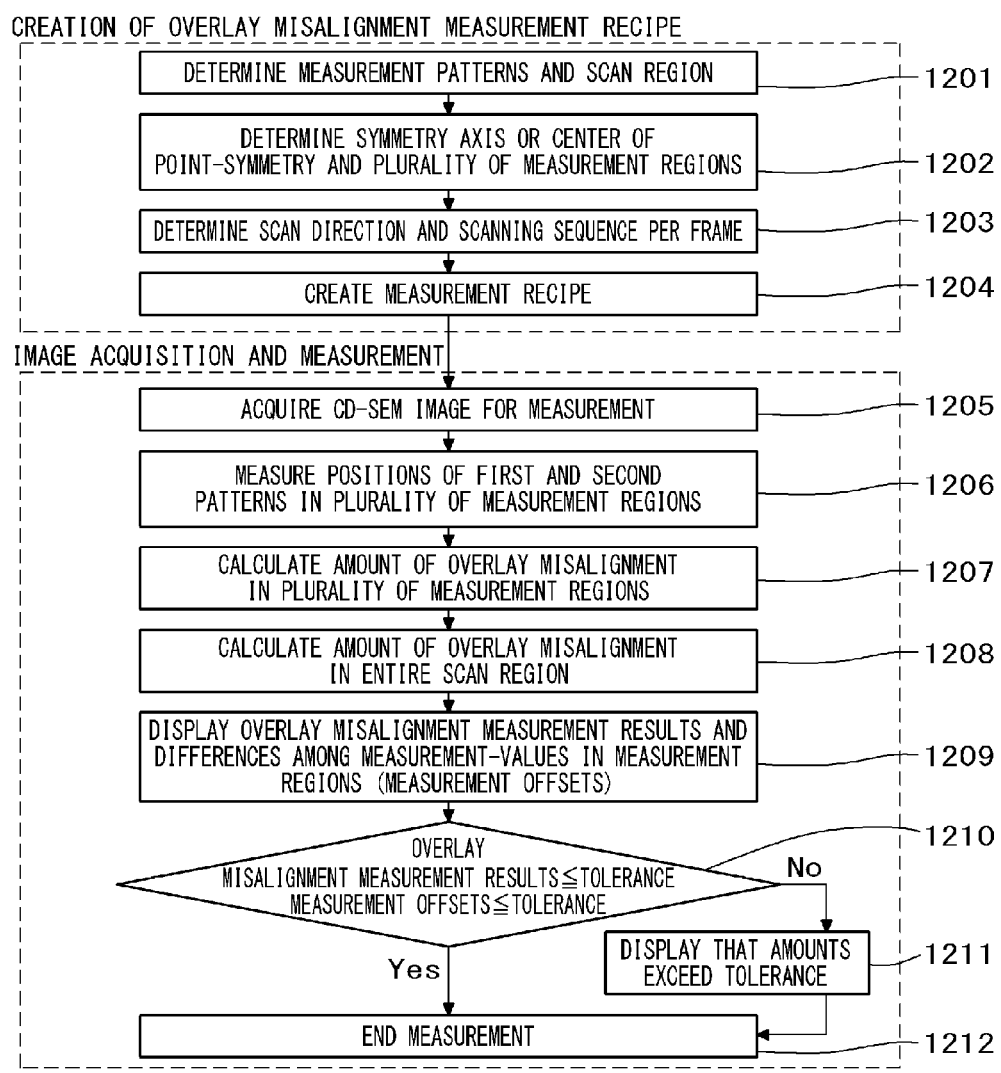
FIG. 12 is a flowchart of overlay misalignment measurement according to the third embodiment.

FIG. 12 is a flowchart according to the third embodiment. While the flow of FIG. 10 might determine the scan directions and the scan sequences within the scan region, the scan direction and the scanning sequence are determined per frame in the flow of the present embodiment.

Fourth Embodiment

According to the flowchart of FIG. 10, after the measurement patterns and the scan region have been determined, it is necessary to determine the symmetry axis or the center of point-symmetry and a plurality of measurement regions in the scan region, and to lastly determine the scan directions and the scan sequences. It is possible to manually create the recipe while observing the patterns on the wafer. Alternatively, by using pattern layout information such as design data, these parameters can be determined without observing the patterns on the wafer. Using the design data, it is possible to confirm the symmetry of the patterns and automatically extract the center of symmetry or the symmetry axis. The center of symmetry or the symmetry axis is extracted from the symmetry of the patterns, and it is possible to automatically determine the scan directions and the scan sequences using the extracted parameter.

The measurement position information 315 and the pattern design information 316 shown in FIG. 3 are normally included in an apparatus different from the CD-SEM. For example, the pattern design information is included in a circuit pattern design layout tool or the like. Connecting a program that has simple design layout view and edit functions and a function capable of designating parameters necessary for the measurement by the CD-SEM to the CD-SEM makes it possible to refer to the information necessary to create the measurement recipe of the CD-SEM. Configuring a measurement system such that a center-of-symmetry automatic extraction function using the design data and a function to automatically determine the scan directions and the scan sequences are incorporated into this program and the program is connected to the CD-SEM makes it possible to realize automation of the functions.

While the present invention has been described so far in the first embodiment while using the overlay misalignment measurement after the second lithography in the double patterning shown in FIGS. 4(a) and 4(b), the present invention is also applicable to the overlay misalignment measurement not only after the lithography but also after etching. Furthermore, the present invention can be applied not only to the overlay misalignment measurement in the same layer by the double patterning but also to, for example, the overlay misalignment measurement among three different layers including an active layer, a gate layer, and a contact layer of a logic device. Likewise, the present invention is applicable to the overlay misalignment measurement among different layers of a memory device. Moreover, while the present invention may be applied to the measurement in a case where the second patterns are exposed to the surface like the resist patterns, the present invention is also applicable to the measurement in a case where the second patterns are etched, a film is further deposited thereon, and the second patterns are not exposed to the surface thereafter. In the latter case, it is necessary to use not the shape contrast but the voltage contrast due to the electric charge similarly to the first pattern for the measurement of the position of the center of gravity of the second patterns.

The present invention has been described while referring to the example of using the secondary electrons reflecting the voltage contrast for the measurement of the position of the first pattern. The present invention is also effective in a case of detecting the position of the first pattern using, for example, reflected electrons. If high-energy reflected electrons are detected, the voltage contrast of the substrate surface is relatively less influential. However, if only the high-energy reflected electrons are selected and detected, the quantity of signals decreases to degrade the signal S/N ratio. To improve the S/N ratio, it is necessary to detect the reflected electrons including a certain proportion of low-energy reflected electrons. In this case, the voltage contrast on the surface influences the detection, and measurement offsets resulting from the asymmetry of electric charge are generated. Therefore, the measurement scheme of the present invention is also effective if the lower layer pattern is detected using the reflected electrons.

The present invention is not limited to the embodiments described so far and encompasses various modifications. For example, the abovementioned embodiments have been described in detail for describing the present invention so that the present invention is easy to understand. The present invention is not always limited to the examples having all the configurations described so far. Moreover, the configuration of the certain embodiment can be partially replaced by the configuration of the other embodiment or the configuration of the other embodiment can be added to the configuration of the certain embodiment. Furthermore, for a part of the configuration of each embodiment, the other configuration can be added, deleted or replaced.

Lastly, the present invention has been described while referring to the scanning electron microscope; however, the present invention is applicable not only to the other general-purpose SEMs but also to various charged particle beam apparatuses. Moreover, as the electron beams for scanning, charged particle beams having another polarity such as ion beams can be applied.

DESCRIPTION OF REFERENCE CHARACTERS

11: First pattern
12: Second pattern
13: Electron beam scan direction
14: Electron beam scan sequence
301: Electron gun
302: Condenser lens
303: Deflector
304: Objective lens
305: Wafer
306: Wafer stage
307: Secondary electron
308: Detector
309: Control unit
310: Image processing unit
311: Analysis/arithmetic unit
312: Measurement recipe GUI
313: Recording device
314: Output/display
315: Measurement position information
316: Pattern design information
41: Resist pattern
42: Si-containing anti-reflection film (SiARC)
43: Spin on Carbon (SOC)
44: SiN film
45: SiO film
46: Si substrate
71: Center of point-symmetry
81: Symmetry axis
91: Measurement offset
92: Measurement region A
93: Measurement region B
94: Measurement region C
95: Measurement region D

The invention claimed is:
1. A measurement system comprising:
a charged particle beam system configured to scan a charged particle beam on a substrate which includes a first pattern and a second pattern formed in a layer above the first pattern; and
a controller configured to control the charged particle beam system to scan the charged particle beam on the substrate according to a predetermined measurement recipe which specifies a scan region including a center of point-symmetry on the substrate, a plurality of measurement regions on the substrate which are symmetrical about the center of point-symmetry, a scan sequence of the charged particle beam which is symmetrical about the center of point-symmetry, and scanning directions of the scan sequence,
wherein the charged particle beam is scanned across the measurement regions a plurality of times according to the scan sequence and the scanning directions thereof to alternate between scanning the charged particle beam in odd-numbered scans on a first side of the center of point symmetry and in even-numbered scans on a second side of the center of point symmetry opposite the first side to obtain an image of the first and second patterns in the measurement regions; and
a processor programmed to:
measure relative positions of the first and second patterns in each of the measurement regions from the obtained image, and
determine an overlay misalignment of the first and second patterns in the scan region from the measured relative positions,
wherein the overlay misalignment is determined for a first axial direction and a second axial direction perpendicular to the first axial direction from the obtained image.

2. The measurement system according to claim 1, wherein the scanning of the charged particle beam in the odd-numbered scans on the first side of the center of point symmetry have a same scanning direction, and the scanning of the charged particle beam in the even-numbered scans on the second side of the center of point symmetry have a same scanning direction opposite to the scanning direction in the odd-numbered scans.

3. The measurement system according to claim 1, wherein the scanning of the charged particle beam in the odd-numbered scans on the first side of the center of point symmetry alternate in opposite scanning directions, and the scanning of the charged particle beam in the even-numbered scans on the second side of the center of point symmetry alternate in opposite scanning directions, and
wherein a first of the odd-numbered scans and a first of the even-numbered scans are in opposite directions.

4. The measurement system according to claim 1, wherein the odd-numbered scans and the even-numbered scans are in parallel and diverge from the center of point-symmetry.

5. The measurement system according to claim 1, wherein the odd-numbered scans and the even-numbered scans are in parallel and converge towards the center of point-symmetry.

6. The measurement system according to claim 1, wherein the scanning directions form a predetermined angle with respect to one of the first and second patterns.

7. The measurement system according to claim 1, wherein the processor is further programmed to:
calculate amounts of overlay misalignment in the measurement regions from the measured relative positions of the first and second patterns in each of the measurement regions, and
display differences in the calculated amounts of overlay misalignment in the measurement regions which are symmetrical with each other about the center of point-symmetry.

8. The measurement system according to claim 7, wherein the processor is further programmed to:
calculate the overlay misalignment of the scan region as an overall amount of overlay misalignment in the scan region from the respective amounts of overlay misalignment in the measurement regions which are symmetrical with each other about the center of point-symmetry.

9. A measurement system comprising:
a charged particle beam system configured to scan a charged particle beam on a substrate which includes a first pattern and a second pattern formed in a layer above the first pattern; and
a controller configured to control the charged particle beam system to scan the charged particle beam on the substrate according to a predetermined measurement recipe which specifies a scan region including a symmetry axis on the substrate, a plurality of measurement regions on the substrate which are symmetrical about the symmetry axis, a scan sequence of the charged particle beam which is symmetrical about the symmetry axis, and scanning directions of the scan sequence parallel to a first axial direction,
wherein the charged particle beam is scanned across the measurement regions a plurality of times according to the scan sequence and the scanning directions thereof to alternate between scanning the charged particle beam in odd-numbered scans on a first side of the symmetry axis and in even-numbered scans on a second side of the symmetry axis opposite the first side to obtain an image of the first and second patterns in the measurement regions; and
a processor programmed to:
measure relative positions of the first and second patterns in each of the measurement regions from the obtained image, and
determine an overlay misalignment in a second axial direction of the of the first and second patterns in the scan region from the measured relative positions.

10. The measurement system according to claim 9, wherein the scanning of the charged particle beam in the odd-numbered scans on the first side of the symmetry axis have a same scanning direction, and the scanning of the charged particle beam in the even-numbered scans on the second side of the symmetry axis have the same scanning direction as the odd-numbered scans.

11. The measurement system according to claim 9, wherein the odd-numbered scans and the even-numbered scans converge towards the symmetry axis.

12. The measurement system according to claim 9, wherein the processor is further programmed to:
calculate amounts of overlay misalignment in the measurement regions in the second axial direction from the measured relative positions of the first and second patterns in the second axial direction, and
display differences in the calculated amounts of overlay misalignment in the measurement regions.

13. The measurement system according to claim 9, wherein the processor is further programmed to:
calculate the overlay misalignment of the scan region as an overall amount of overlay misalignment in the scan region from the respective amounts of overlay misalignment in the measurement regions.

14. A measurement method comprising:
scanning a charged particle beam on a substrate, which includes a first pattern and a second pattern formed in a layer above the first pattern, according to a predetermined measurement recipe which specifies a scan region including a center of point-symmetry on the substrate, a plurality of measurement regions on the substrate which are symmetrical about the center of point-symmetry, a scan sequence of the charged particle beam which is symmetrical about the center of point-symmetry, and scanning directions of the scan sequence,
wherein the charged particle beam is scanned across the measurement regions a plurality of times according to the scan sequence and the scanning directions thereof to alternate between scanning the charged particle beam in odd-numbered scans on a first side of the center of point symmetry and in even-numbered scans on a second side of the center of point symmetry opposite the first side to obtain an image of the first and second patterns in the measurement regions;
measuring relative positions of the first and second patterns in each of the measurement regions from the obtained image; and
determining an overlay misalignment of the first and second patterns in the scan region from the measured relative positions,
wherein the overlay misalignment is determined for a first axial direction and a second axial direction perpendicular to the first axial direction from the obtained image.

15. The measurement method according to claim 14, wherein the scanning of the charged particle beam in the odd-numbered scans on the first side of the center of point symmetry have a same scanning direction, and the scanning of the charged particle beam in the even-numbered scans on the second side of the center of point symmetry have a same scanning direction opposite to the scanning direction in the odd-numbered scans.

16. The measurement method according to claim 14, wherein the scanning of the charged particle beam in the odd-numbered scans on the first side of the center of point symmetry alternate in opposite scanning directions, and the scanning of the charged particle beam in the even-numbered scans on the second side of the center of point symmetry alternate in opposite scanning directions, and
wherein a first of the odd-numbered scans and a first of the even-numbered scans are in opposite directions.

17. The measurement method according to claim 14, wherein the odd-numbered scans and the even-numbered scans are in parallel and diverge from the center of point-symmetry.

18. The measurement method according to claim 14, wherein the odd-numbered scans and the even-numbered scans are in parallel and converge towards the center of point-symmetry.

19. The measurement method according to claim 14, wherein the scanning directions form a predetermined angle with respect to one of the first and second patterns.

20. The measurement method according to claim 1, further comprising:
calculating amounts of overlay misalignment in the measurement regions from the measured relative positions of the first and second patterns in each of the measurement regions, and
displaying differences in the calculated amounts of overlay misalignment in the measurement regions which are symmetrical with each other about the center of point-symmetry.

* * * * *